(12) United States Patent
Cosan et al.

(10) Patent No.: US 6,339,352 B1
(45) Date of Patent: Jan. 15, 2002

(54) ANTICIPATORY SCHMITT TRIGGER

(75) Inventors: Muhammet Cosan; Harold R. Schnetzka, both of York, PA (US)

(73) Assignee: York International Corporation, York, PA (US)

( * ) Notice: Subject to any disclaimer, the term of this patent is extended or adjusted under 35 U.S.C. 154(b) by 0 days.

(21) Appl. No.: 09/810,662

(22) Filed: Mar. 19, 2001

(51) Int. Cl.$^7$ ............................................. H03K 3/037
(52) U.S. Cl. ..................................................... 327/205
(58) Field of Search ................................. 327/205, 206, 327/73, 74, 78, 79, 89, 90, 563; 330/281, 282

(56) References Cited

U.S. PATENT DOCUMENTS

| | | | |
|---|---|---|---|
| 3,151,256 A | 9/1964 | Simon et al. | 307/88.5 |
| 3,205,445 A | 9/1965 | Cubert | 328/150 |
| 3,222,543 A | 12/1965 | Moy et al. | 307/88.5 |
| 3,283,179 A | 11/1966 | Carlisle et al. | 307/133 |
| 3,434,059 A | 3/1969 | Kesolits | 328/117 |
| 3,471,718 A | 10/1969 | Weisz | 307/290 |
| 3,584,241 A | 6/1971 | Nakamura | 307/290 |
| 3,609,407 A | 9/1971 | Garuts | 307/264 |
| 3,701,953 A | 10/1972 | Lubarsky, Jr. | 328/155 |
| 3,805,147 A | 4/1974 | Williams | 323/21 |
| 3,816,767 A | 6/1974 | Meri | 307/288 |
| 3,895,365 A | 7/1975 | Freed | 340/198 |
| 4,024,457 A | 5/1977 | Riddle | 323/35 |
| 4,188,549 A * | 2/1980 | Dorais | 327/205 |
| 4,417,199 A | 11/1983 | Jones | 323/319 |
| 4,682,049 A * | 7/1987 | Kirschner et al. | 327/205 |
| 4,786,825 A | 11/1988 | O'Shaughnessy et al. | 327/205 |
| 5,489,866 A | 2/1996 | Diba | 327/206 |
| 5,592,112 A * | 1/1997 | Nishibe | 327/87 |
| 5,808,516 A * | 9/1998 | Barber | 330/282 |
| 5,844,430 A * | 12/1998 | Thurnau et al. | 327/74 |
| 5,969,547 A * | 10/1999 | Pernyeszi | 327/73 |

* cited by examiner

Primary Examiner—My-Trang Nu Ton
(74) Attorney, Agent, or Firm—Finnegan, Henderson, Farabow, Garrett & Dunner, L.L.P.

(57) ABSTRACT

A system and method for providing an anticipatory Schmitt trigger circuit that changes the output level of the trigger circuit in anticipation of crossing a predetermined voltage value such as a zero voltage level. In an exemplary embodiment, the anticipatory Schmitt trigger includes a comparator, a feedback resistor, an input resistor, a pull-up resistor, a plurality of voltage divider resistors, and a capacitor.

24 Claims, 10 Drawing Sheets

ANTICIPATORY SCHMITT TRIGGER

BACKGROUND OF THE INVENTION

I. Field of Invention

The present invention is directed to a trigger circuit, and more particularly to a Schmitt trigger circuit that anticipates a voltage crossing.

II. Description of the Related Art

A Schmitt trigger is a class of triggering circuit. Among other things, the Schmitt trigger serves as a signal conditioning device or as a threshold detector for switching purposes. As a signal conditioner, the Schmitt trigger takes an input voltage signal, for example a noisy input signal, and conditions the input voltage signal by limiting the output voltage signal to a logic-high or a logic-low. As a threshold detector, the Schmitt trigger may be used as a switch that is activated when an input signal crosses zero volts.

Generally, a conventional Schmitt trigger circuit changes output voltage level in response to a change in the input voltage. For example, a conventional Schmitt trigger changes output states from a logic-high to a logic-low after the input voltage makes a zero crossing and then reaches a first threshold voltage and changes output states from a logic-low to a logic-high after the input voltage makes another zero crossing and then reaches a second threshold voltage. FIG. 9 illustrates an exemplary wiring scheme for a conventional Schmitt trigger circuit of the non-inverting type.

Referring to FIG. 9, the conventional Schmitt trigger circuit 1000 includes a resistor ($R_1$) 1010, a feed-back resistor ($R_2$) 1015, an operational amplifier 1020, a voltage source ($V_{source}$) 1005, and a voltage output ($V_{out}$) 1030.

Hysteresis diagrams (also referred to as voltage transfer curves) illustrate the operation of Schmitt trigger circuits by indicating when a Schmitt trigger changes logic states at the output (e.g., $V_{out}$) in response to a change in the source voltage ($V_{source}$). The hysteresis diagram for a conventional Schmitt trigger of the non-inverting type is shown at FIG. 4. The hysteresis drawing for a conventional Schmitt trigger of the inverting type is also shown at FIG. 7.

Referring to FIGS. 4 and 9, the conventional Schmitt trigger circuit of FIG. 9 has two threshold voltages. As the source voltage ($V_{source}$) 1005 approaches the first threshold ($V_{1T}$) voltage, the source voltage ($V_{source}$) 1005 increase in value as it crosses zero. During this time, the voltage output ($V_{out}$) 1030 is at a low voltage state ($V_L$)(see, e.g., FIG. 4 at 420, 450). When the source voltage ($V_{source}$) 1005 reaches the first threshold voltage ($V_{1T}$), the voltage output ($V_{out}$) 1030 transitions to a high output voltage state ($V_H$) (see, e.g., FIG. 4 at 460 and 470).

Alternatively, when the source voltage ($V_{source}$) 1005 begins to decrease in value (see, e.g., FIG. 4 at 480), the voltage output ($V_{out}$) 1030 remains at a high voltage state (FIG. 4 at 440) until the source voltage ($V_{source}$) 1005 crosses zero and reaches the second threshold voltage ($V_{2T}$). When the source voltage ($V_{source}$) 1005 reaches the second threshold voltage ($V_{2T}$) (see, e.g., FIG. 4 at 430), the voltage output ($V_{out}$) 1030 transitions to a low voltage state ($V_L$) (see, e.g., FIG. 4 at 430 and 410). Accordingly, the voltage output ($V_{out}$) 1030 of a conventional Schmitt trigger circuit changes output voltage states only after the source voltage ($V_{source}$) 1005 crosses zero and reaches the appropriate threshold voltage (e.g., $V_{2T}$, $V_{1T}$).

SUMMARY OF THE INVENTION

Accordingly, the present invention is directed to a Schmitt trigger circuit, preferably an anticipatory Schmitt trigger circuit that transitions the output voltage in anticipation of the input voltage crossing a predetermined value.

An object of the present invention is to provide an improved Schmitt trigger that overcomes or minimizes one or more of the limitations and disadvantages of the presently available Schmitt trigger circuits. Among other things, the invention switches the output value in anticipation of the input voltage crossing a predetermined value (e.g., zero volts). By triggering or switching the anticipatory Schmitt trigger circuit in anticipation of crossing a predetermined value, the present invention overcomes one or more of the limitations of past and related approaches.

Additional features and advantages of the invention will be set forth in part in the description which follows and in part will be obvious from the description, or may be learned by practice of the invention. The objectives and advantages of the invention may be realized and attained by the system and method particularly pointed out in the written description and claims hereof as well as the appended drawings.

To achieve these and other advantages and in accordance with the purpose of the invention, as embodied and broadly described herein, there is provided a trigger circuit including, for example, a comparator; a feedback resistor connected to the comparator; an input resistor connected to the comparator, to the feedback resistor, and to a voltage source; a pull-up resistor connected to the feedback resistor and to the output of the comparator; a plurality of voltage divider resistors, wherein at least one of the plurality of voltage divider resistors is connected to the output of the comparator and to an input of the comparator; and a capacitor connected in parallel to at least one of the plurality of voltage divider resistors.

In another embodiment of the present invention, there is provided a trigger circuit including a comparator with a plurality of inputs and an output; an input resistor connecting one of the inputs of the comparator with an input voltage; a feedback resistor connecting one of the inputs of the comparator to a pull-up resistor and connecting one of the inputs of the comparator to the output of the comparator; and a first voltage divider resistor connected to a capacitor, to one of the inputs of the comparator, and to a second voltage divider resistor, wherein the second voltage divider resistor further connects to the output of the comparator, wherein the product of the resistance values for the first voltage divider resistor and the feedback resistor exceeds the product of the resistance values for the input resistor and the second voltage divider resistor when the trigger circuit is of the non-inverting type.

In yet another embodiment of the present invention, there is provided a method of triggering a circuit including, for example, switching the output voltage from a high value to a low value, when an input to the trigger circuit decreases from a first value and when the input voltage crosses an upper threshold voltage, wherein the switching occurs in anticipation of crossing a predetermined voltage value; and changing the output voltage from the low value to the high value, when the input to the trigger circuit increases from a second value and when the input voltage crosses a lower threshold voltage, wherein the changing occurs in anticipation of crossing the predetermined voltage value.

It is to be understood that both the foregoing general description and the following detailed description are exemplary and explanatory only and are not restrictive of the invention, as described.

BRIEF DESCRIPTION OF THE DRAWINGS

The accompanying drawings, which are incorporated in and constitute a part of this specification, illustrate an embodiment of the invention and, together with the description, serve to explain the objects, advantages and principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Generally, the present invention is directed to a triggering circuit and, more particularly, to an anticipatory Schmitt trigger circuit that changes the output level of the trigger circuit in anticipation of a predetermined value.

Figure 1:
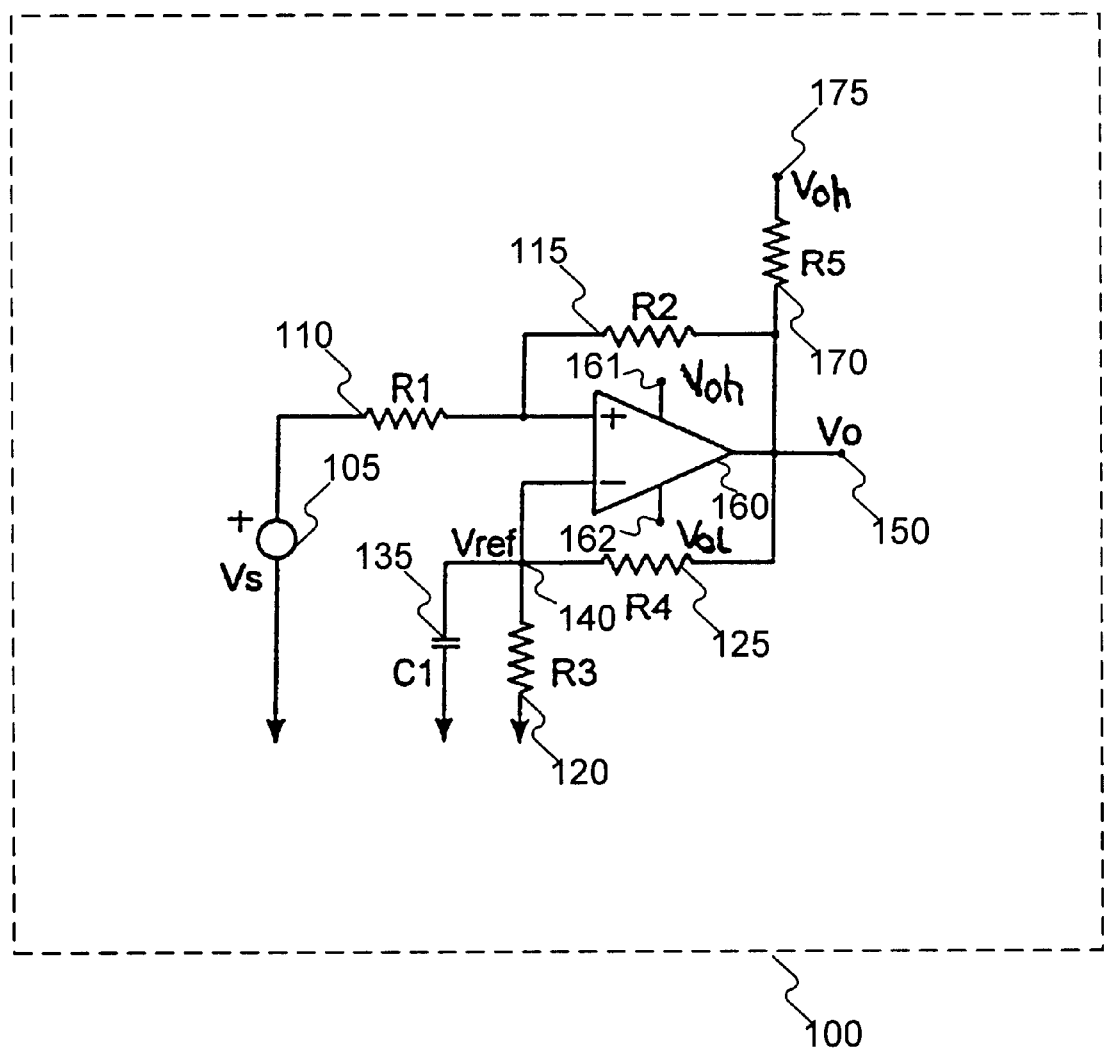
FIG. 1 illustrates an exemplary wiring scheme for providing an anticipatory Schmitt trigger circuit of the non-inverting type, in accordance with the present invention.

FIG. 1 illustrates an example wiring scheme for providing an anticipatory Schmitt trigger circuit 100 of the non-inverting type, in accordance with the present invention. Referring to FIG. 1, the anticipatory Schmitt trigger circuit 100 includes, inter alia, a input voltage ($V_s$) 105, a comparator 160, a feedback resistor (R2) 115, an input resistor (R1) 110, a pull-up resistor (R5) 170, a plurality of voltage divider resistors (R3, R4) 120, 125, a capacitor (C1) 135, and a voltage output ($V_o$) 150. In an exemplary embodiment, the Motorola MC 3302 serves as a comparator.

Figure 2:
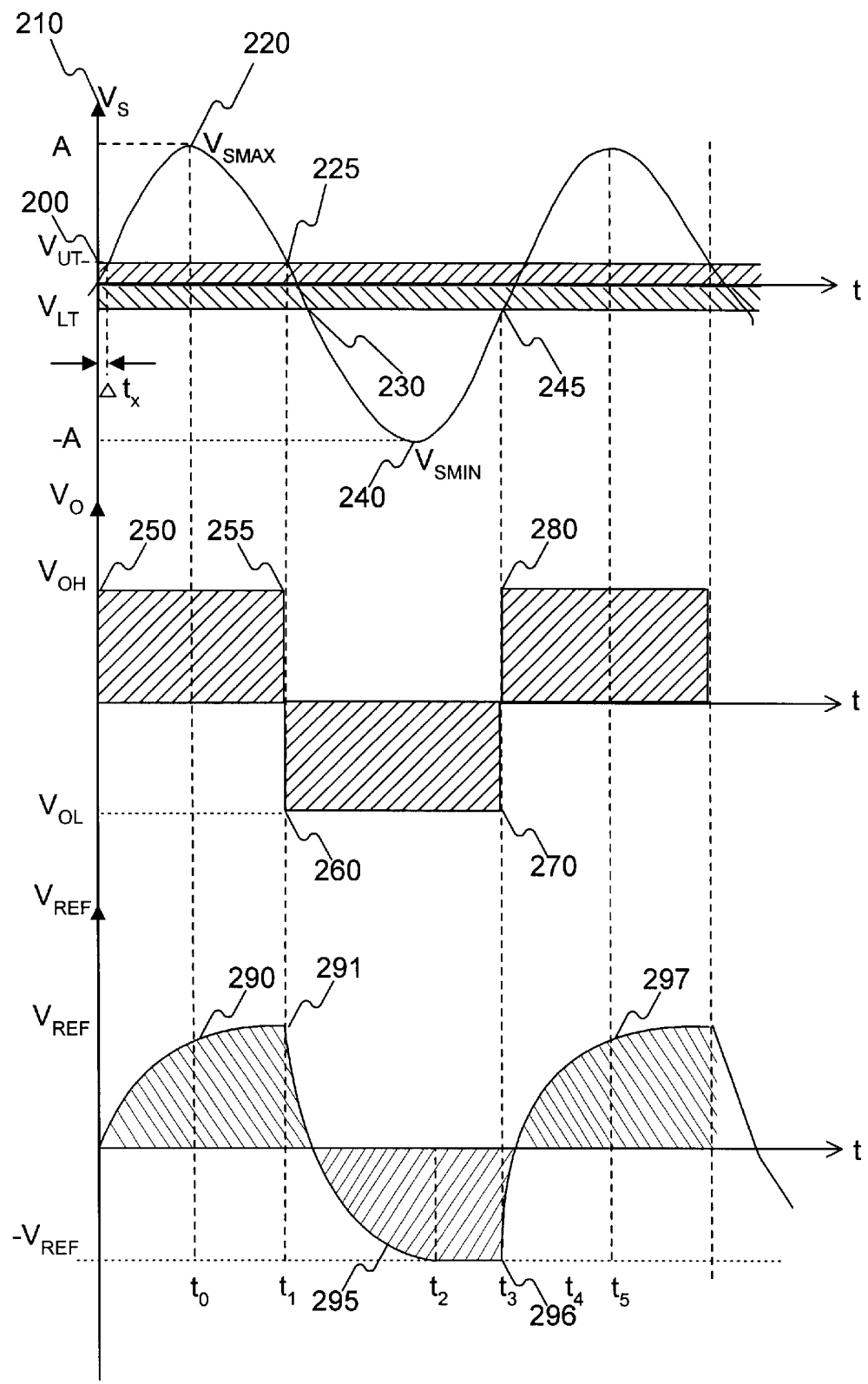
FIG. 2 illustrates exemplary plots of various voltages over time for an anticipatory Schmitt trigger circuit, in accordance with the present invention.

FIG. 2 illustrates exemplary plots of various voltages over time for an anticipatory Schmitt trigger consistent with the wiring scheme of FIG. 1. Referring to FIG. 2, the input voltage ($V_s$) 105 to the anticipatory Schmitt trigger circuit is preferably a time varying voltage and, more preferably, a time varying voltage as shown in FIG. 2 (see, e.g., FIG. 2 at 200, 220, 230, and 240).

Referring to FIGS. 1 and 2, when the input voltage ($V_s$) 105 is greater than the upper threshold voltage ($V_{UT}$), the voltage output level of the anticipatory Schmitt trigger circuit ($V_o$) 150 equals a high output voltage ($V_{OH}$) 250. When the input voltage ($V_s$) 105 decreases from a maximum voltage 220 and then equals the upper threshold voltage ($V_{UT}$) 225, the output voltage ($V_o$) 150 transitions to an output low voltage ($V_{OL}$) 255, 260. Accordingly, the output voltage ($V_o$) 150 transitions to an output low voltage ($V_{OL}$) 260 in anticipation of crossing a predetermined voltage value (e.g., zero). Although this embodiment describes the anticipatory Schmitt trigger circuit 100 changing output voltage values in anticipation of the input voltage ($V_s$) making a zero crossing, the anticipatory Schmitt trigger circuit 100 may change output voltage values in anticipation of the input voltage ($V_s$) crossing a predetermined value that is biased about a non-zero value.

The output voltage ($V_o$) 150 remains at an output low voltage ($V_{OL}$) until the input voltage ($V_s$) 105 increases from a minimum voltage 240 and then equals the lower threshold voltage ($V_{LT}$). When the input voltage ($V_s$) equals the lower threshold voltage ($V_{LT}$) 245, the output voltage ($V_o$) transitions to an output high voltage ($V_{OH}$) 270, 280. Accordingly, the output voltage ($V_o$) 150 transitions to a high voltage ($V_{OH}$) 270, 280 in anticipation of the input voltage ($V_s$) 105 crossing a predetermined voltage (e.g., zero). The output voltage ($V_o$) 150 remains at an output high level until the input voltage ($V_s$) 105 once again decreases from a maximum voltage 220 and equals the upper threshold voltage ($V_{UT}$).

The upper threshold voltage ($V_{UT}$) of the anticipatory Schmitt trigger designed in accordance with the present invention as illustrated in FIG. 1 may be determined by the following equation:

$$V_{UT} = V_{OH}\left(\frac{R2 \cdot R3 - R1 \cdot R4}{R2(R3 + R4)}\right)$$

Referring to FIG. 1, $V_{OH}$ is the output high voltage, R1 is the input resistor, R2 is the feedback resistor, R3 is the first voltage divider resistor, and R4 is the second voltage divider resistor. The resistors R2, R3, R1, and R4 may be selected according to the following equation:

(R3)(R2)>(R1)(R4)

The lower threshold voltage ($V_{LT}$) of the anticipatory Schmitt trigger designed in accordance with the present invention as illustrated in FIG. 1 may be determined by the following equation:

$$V_{LT} = V_{OL}\left(\frac{R2 \cdot R3 - R1 \cdot R4}{R2(R3 + R4)}\right)$$

The capacitor (C1) 135 value may be determined according to the following equation:

$$C1 = \tau\left(\frac{R_3 + R_4}{R_3 \cdot R_4}\right)$$

where tau ($\tau$) is determined by the following equation:

$$\tau > \frac{2}{5}(\Delta t_x)$$

and $\Delta t_x$ is determined by the following equation:

$$\Delta t_x = \frac{1}{2\pi f} \sin^{-1}\left(\frac{V_{UT}}{A}\right)$$

where Vs(t)=A sin (2π ft) and at t=$\Delta t_x$, $V_s$=$V_{UT}$; f is the frequency in Hertz of the source voltage (e.g., $V_s$ 105 at FIG. 1); A is the magnitude of the source voltage; π is pi; and $V_{UT}$ is the upper threshold voltage.

Figure 3:
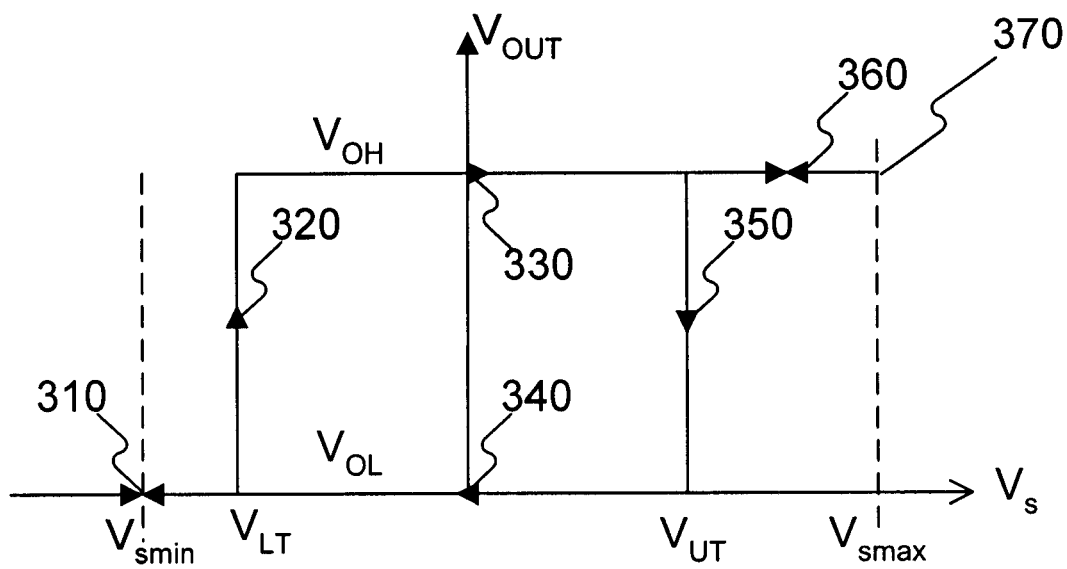
FIG. 3 illustrates an exemplary hysteresis diagram for an anticipatory Schmitt trigger circuit of the non-inverting type, in accordance with the present invention.
Figure 4:
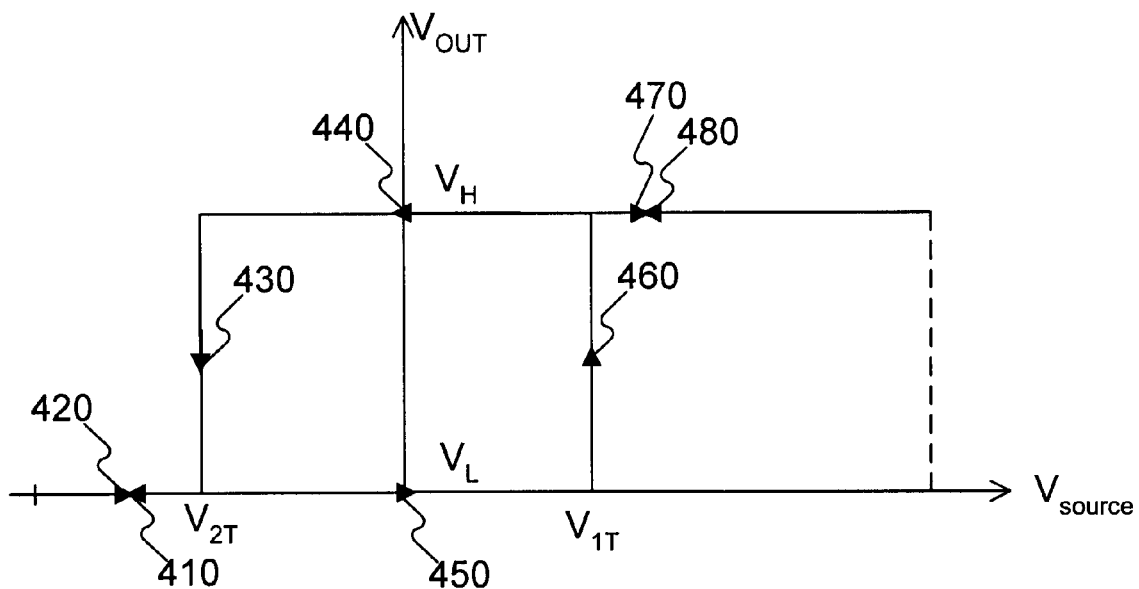
FIG. 4 illustrates an exemplary hysteresis diagram for a conventional Schmitt trigger circuit of the non-inverting type.

FIG. 3 illustrates an exemplary hysteresis diagram for an anticipatory Schmitt trigger circuit of the non-inverting type (see, e.g., FIG. 1). Referring to FIG. 3, as the input voltage ($V_s$) 105 decreases from a maximum voltage ($V_{smax}$) 370 and then equals the upper threshold voltage ($V_{UT}$), the output voltage ($V_o$) 150 transitions from an output high voltage ($V_{OH}$) to an output low voltage ($V_{OL}$) (see, e.g., 360, 350, 340). Accordingly, the hysteresis diagram shows that the output voltage ($V_o$) 150 transitions to an output low voltage ($V_{OL}$) 260 in anticipation of crossing a predetermined voltage value (e.g., zero volts at 340).

The hysteresis diagram of FIG. 3 also illustrates that the output voltage ($V_o$) 150 of a non-inverting type anticipatory Schmitt trigger circuit designed in accordance with the present invention remains at an output low voltage low ($V_{OL}$) until the input voltage ($V_s$) 105 increases from a minimum voltage ($V_{smin}$) 310 and then equals the lower threshold voltage ($V_{LT}$) 320 for the anticipatory Schmitt trigger. When the input voltage ($V_s$) equals the lower threshold voltage ($V_{LT}$), the output voltage ($V_o$) transitions to an output high voltage ($V_{OH}$) (see, e.g., 310, 320, 330). The hysteresis diagram of FIG. 3 illustrates that the output voltage ($V_o$) 150 transitions to a high voltage ($V_{OH}$) in anticipation of the input voltage ($V_s$) 105 crossing a predetermined voltage value (e.g., zero volts at 330).

The output voltage ($V_o$) 150 remains at an output high level ($V_{OH}$) until the input voltage ($V_s$) 105 once again decreases from a maximum voltage ($V_{smax}$) 370 and then equals the upper threshold voltage ($V_{UT}$) 350. The input voltage ($V_s$) 105 may be a time varying input and, as a result, the output voltage ($V_o$) 150 will vary over time in accordance with the hysteresis diagram of FIG. 3. Although FIG. 3 illustrates operation with the predetermined voltage value equal to zero volts (e.g., FIG. 3 at 330 and 340), the predetermined voltage value may also be biased at any non-zero voltage without departing from the spirit of the present invention.

Figure 5:
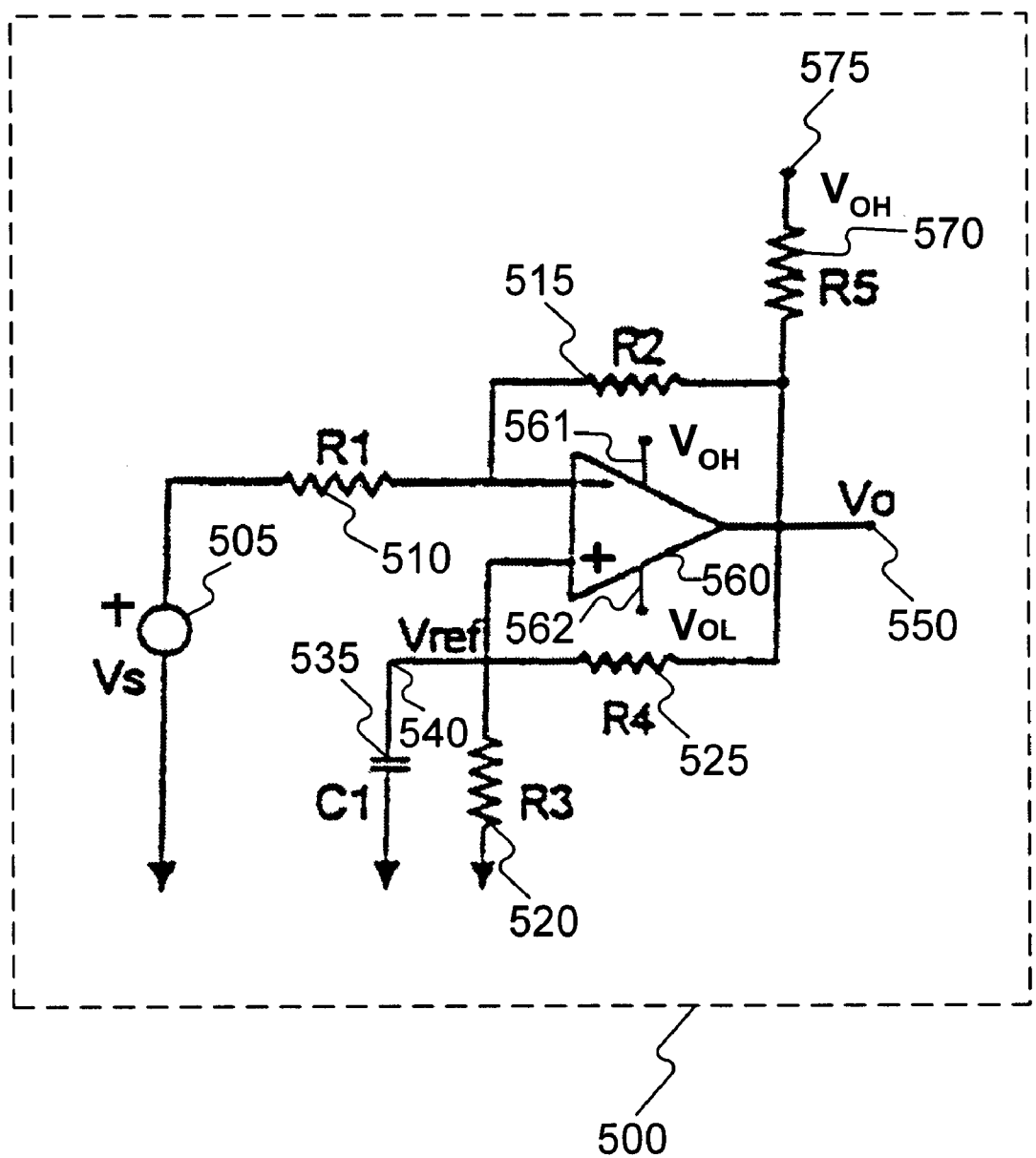
FIG. 5 illustrates an exemplary wiring scheme for providing an anticipatory Schmitt trigger circuit of the inverting type, in accordance with the present invention.

FIG. 5 illustrates an exemplary wiring scheme for providing an anticipatory Schmitt trigger circuit 500 of the inverting type, designed in accordance with the present invention. Referring to FIG. 5, FIG. 5 is similar to FIG. 1 except that the comparator 560 is inverted which makes the anticipatory Schmitt trigger 500 an inverting type anticipatory Schmitt trigger. Referring to FIG. 5, the inverting type anticipatory Schmitt trigger circuit 500 includes, inter alia, a input voltage ($V_s$) 505, a comparator 560, a feedback resistor (R2) 515, an input resistor (R1) 510, a pull-up resistor (R5) 570, a plurality of voltage divider resistors (R3, R4) 520, 525, a capacitor (C1) 535 and a voltage output ($V_o$) 550.

The upper threshold voltage ($V_{UT}$) of the inverting type anticipatory Schmitt trigger circuit 500 may be determined by the following equation:

$$V_{UT} = V_{OH}\left(\frac{R2 \cdot R3 - R1 \cdot R4}{R2(R3 + R4)}\right)$$

Referring to FIG. 5, $V_{OH}$ is the voltage output high, R1 is the input resistor, R2 is the feedback resistor, R3 is the first voltage divider resistor, and R4 is the second voltage divider resistor. In an embodiment, the resistors R2, R3, R1, and R4 are selected according to the following equation:

(R3)(R2)<(R1)(R4)

The lower threshold voltage ($V_{LT}$) of the inverting type anticipatory Schmitt trigger 500 is determined by the following equation:

$$V_{LT} = V_{OL}\left(\frac{R2 \cdot R3 - R1 \cdot R4}{R2(R3 + R4)}\right)$$

Figure 6:
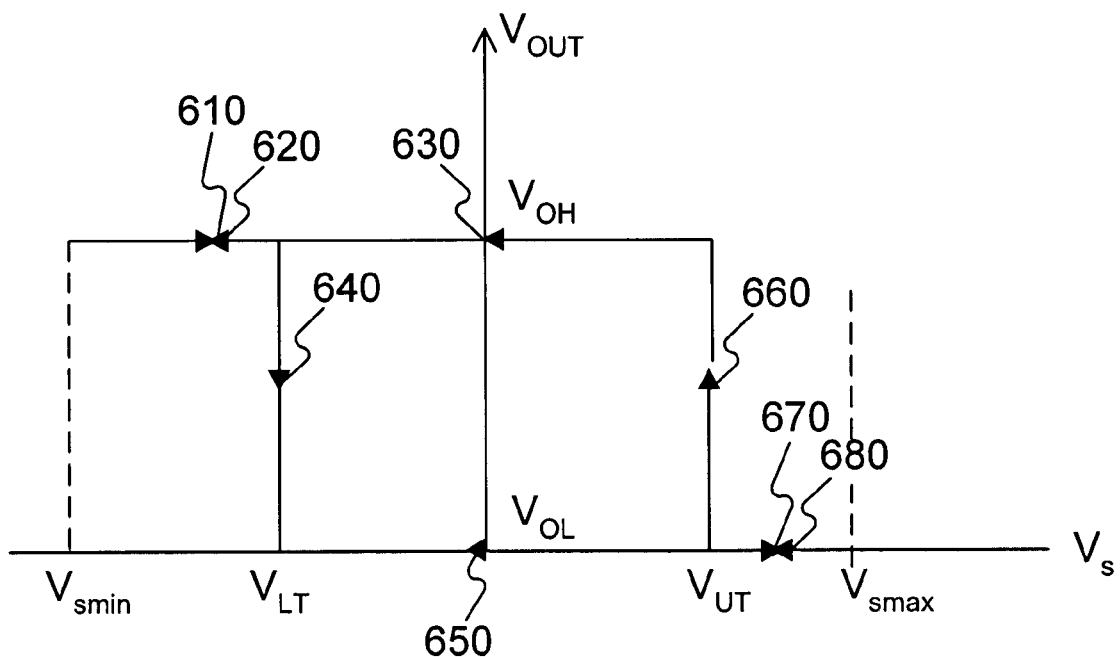
FIG. 6 illustrates an exemplary hysteresis diagram for an anticipatory Schmitt trigger circuit of the inverting type, in accordance with the present invention.
Figure 7:
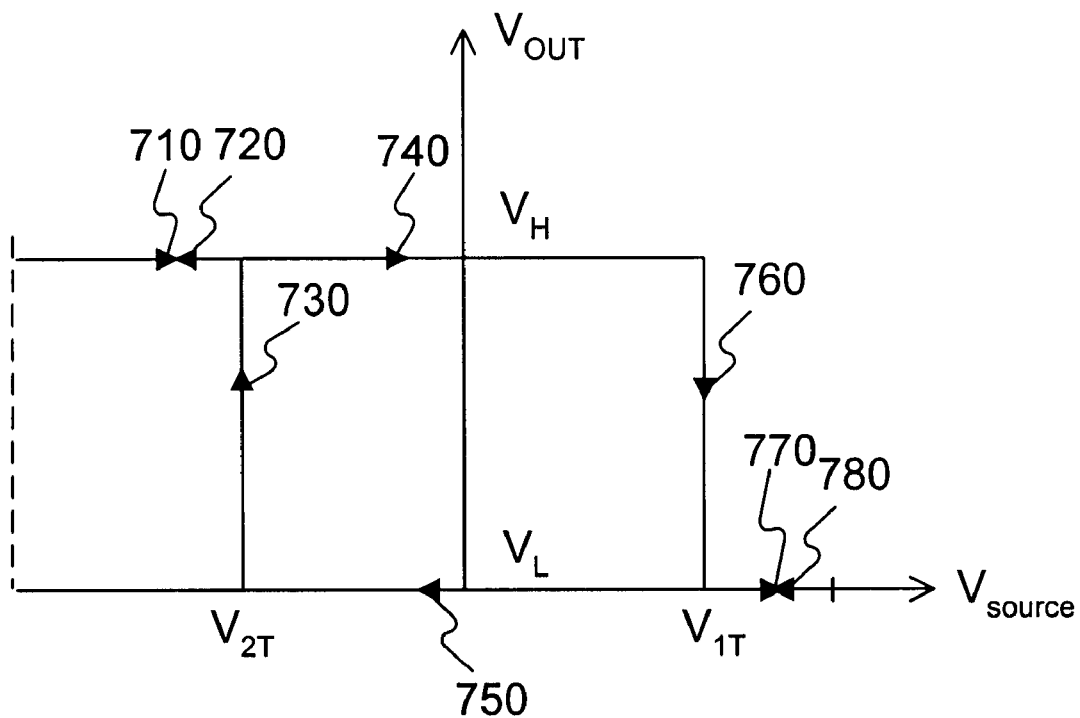
FIG. 7 illustrates an exemplary hysteresis diagram for a conventional Schmitt trigger circuit of the inverting type.

FIG. 6 illustrates an exemplary hysteresis diagram for the inverting type anticipatory Schmitt trigger circuit 500. Referring to FIG. 6, as the input voltage ($V_s$) 105 increases from a minimum voltage ($V_{smin}$) 610 and then equals the lower voltage threshold ($V_{LT}$), the output voltage ($V_o$) 550 transitions from an output high voltage ($V_{OH}$) to an output low voltage ($V_{OL}$) (see, e.g., 610, 640, 650). Accordingly, the hysteresis diagram of FIG. 6 shows that the output voltage ($V_o$) 550 transitions to an output low voltage ($V_{OL}$) in anticipation of crossing a predetermined voltage value (e.g., zero volts at 650).

The hysteresis diagram of FIG. 6 also illustrates that the output voltage ($V_o$) 550 of the inverting type anticipatory Schmitt trigger circuit 500 remains at an output low voltage ($V_{OL}$) until the input voltage ($V_s$) 505 decreases from a maximum voltage ($V_{smax}$) 680 and then equals the upper threshold voltage ($V_{UT}$) 660. When the input voltage ($V_s$) equals the upper threshold voltage ($V_{UT}$), the output voltage ($V_o$) transitions to an output high voltage ($V_{OH}$) (see, e.g., 680, 660, 630). The hysteresis diagram of FIG. 6 illustrates that the output voltage ($V_o$) 550 transitions to a high voltage ($V_{OH}$) in anticipation of the input voltage ($V_s$) 505 crossing a predetermined voltage value (e.g., zero volts at 630). Although FIG. 6 illustrates operation with the predetermined voltage value equal to zero volts (e.g., FIG. 6 at 630 and 650), the predetermined voltage value may also be biased at any non-zero voltage without departing from the spirit of the present invention.

Figure 8:
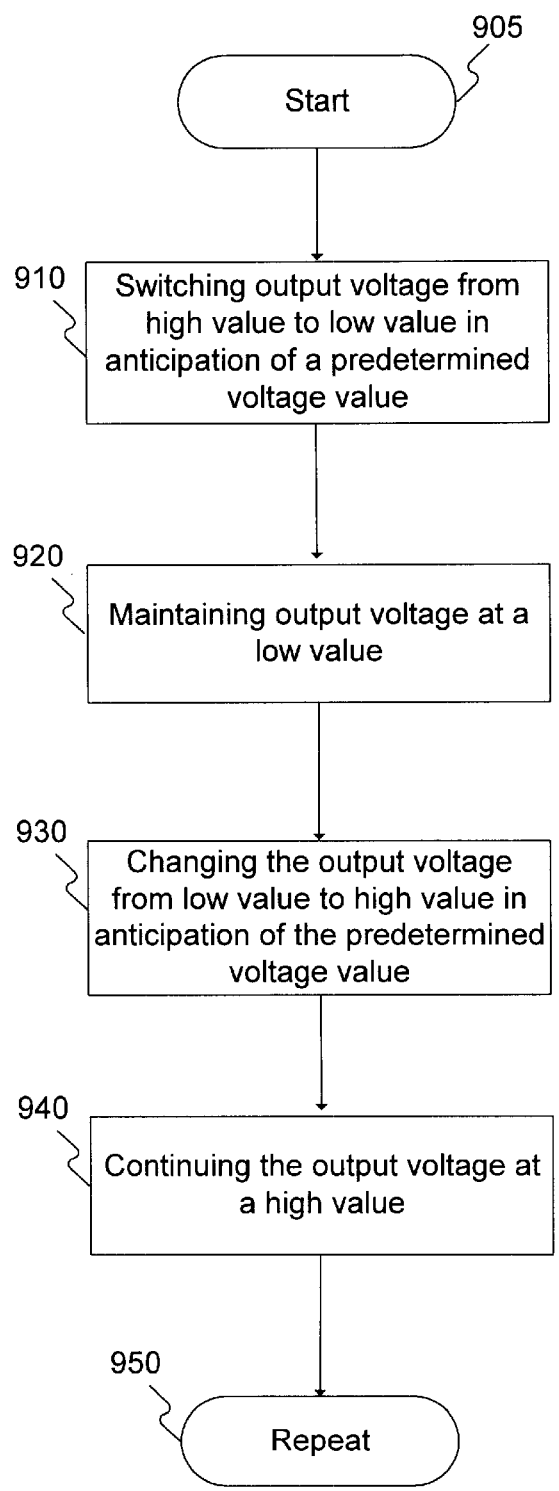
FIG. 8 illustrates a method for providing an anticipatory Schmitt trigger circuit, in accordance with the present invention.
Figure 9:
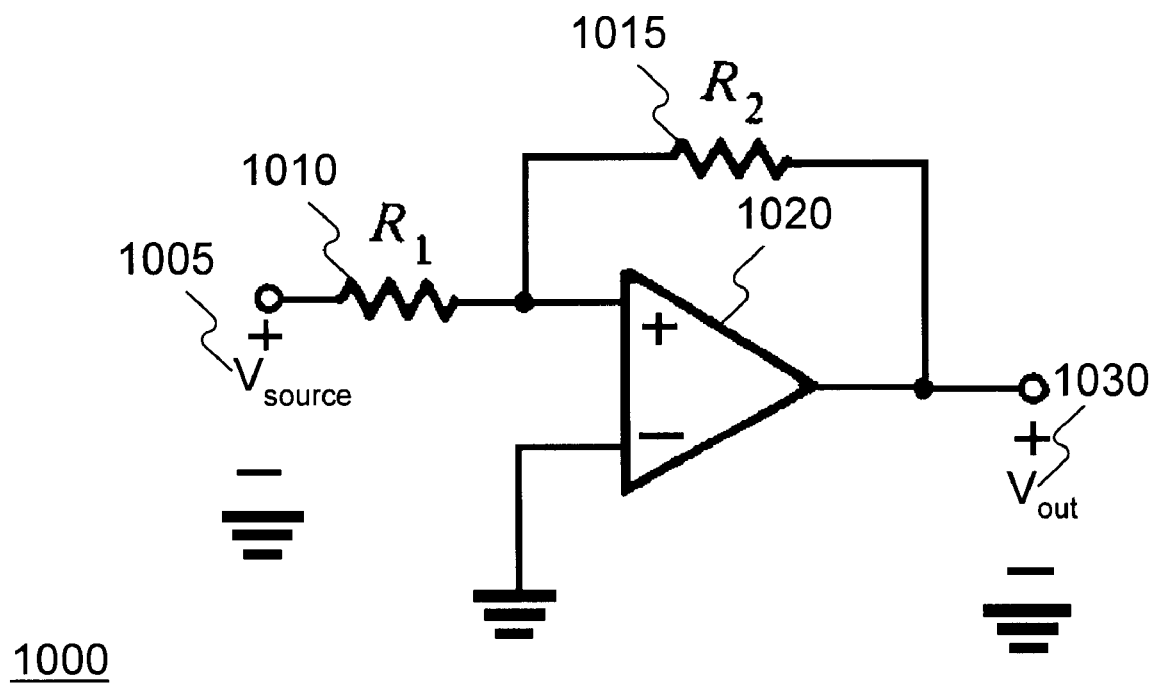
FIG. 9 illustrates an exemplary wiring scheme for a conventional Schmitt trigger circuit of the non-inverting type.

FIG. 8 illustrates the steps 900 for providing an anticipatory Schmitt trigger circuit, in accordance with the present invention. Referring to FIG. 8, the steps 900 are, preferably, performed by the exemplary anticipatory Schmitt trigger circuit of FIG. 1. Although the following embodiment is described with reference the non-inverting type anticipatory Schmitt trigger 100, the inverting type Schmitt trigger may also be used without departing from the spirit of the present invention.

The steps 900 of the method consistent with the present invention begin when the anticipatory Schmitt trigger circuit 100 receives an input voltage ($V_s$) 105 (step 905). When the input voltage ($V_s$) 105 of the exemplary anticipatory Schmitt trigger circuit 100 decreases from a maximum input voltage (e.g., $V_{smax}$) and equals an upper threshold voltage, the output voltage ($V_o$) 150 of the anticipatory Schmitt trigger circuit 100 transitions or switches from a voltage output 150 that is at a high voltage value to a voltage output 150 that is at a low value (step 910) in anticipation of crossing a predetermined voltage value (e.g., making a zero voltage crossing).

The anticipatory Schmitt trigger 100 maintains the voltage output 150 at a low voltage value (step 920) until the input voltage 105 increases from a minimum input voltage value (e.g., $V_{smin}$) and then equals a lower threshold voltage ($V_{LT}$). When the input voltage 105 equals a lower threshold voltage ($V_{LT}$), the anticipatory Schmitt trigger circuit 100 changes output voltages 150 from a low voltage value (e.g., $V_{OL}$) to a high voltage value (e.g., $V_{OH}$) (step 930) in anticipation of crossing a predetermined voltage value (e.g., making a zero voltage crossing).

The output voltage ($V_o$) 150 continues at the high voltage value until the input voltage ($V_s$) 105 once again decreases from a maximum voltage ($V_{smax}$) and then equals the upper threshold voltage ($V_{UT}$), which repeats the steps of the method (step 950) of the present invention.

One of ordinary skill in the art will recognize that the steps 900 associated with the anticipatory Schmitt trigger of the non-inverting type 100 are equally applicable to the inverting type anticipatory Schmitt trigger circuit 500. Although this embodiment describes the anticipatory Schmitt trigger circuit 100 changing output voltage values in anticipation of the input voltage ($V_S$) making a zero crossing, the anticipatory Schmitt trigger circuit 100 may change output voltage values in anticipation of the input voltage (Vs) crossing a predetermined voltage value that is biased about a non-zero value.

Moreover, the equations described herein may be applied when the predetermined voltage value is biased about a zero value (see, e.g., FIG. 3 at 330 and/or 340) biased about a non-zero-value. For example, when the voltage source ($V_s$) is centered about a non-zero value, $V_s$ may take the form of the following equation:

$$V_s = A \sin(\omega t) + B$$

where A is the amplitude in volts of $V_s$; $\omega$ is equal to twice the product of $\pi$ and f; f is the frequency of $V_s$; $\pi$ is pi; and B is the direct current (DC) offset voltage.

Figure 10:
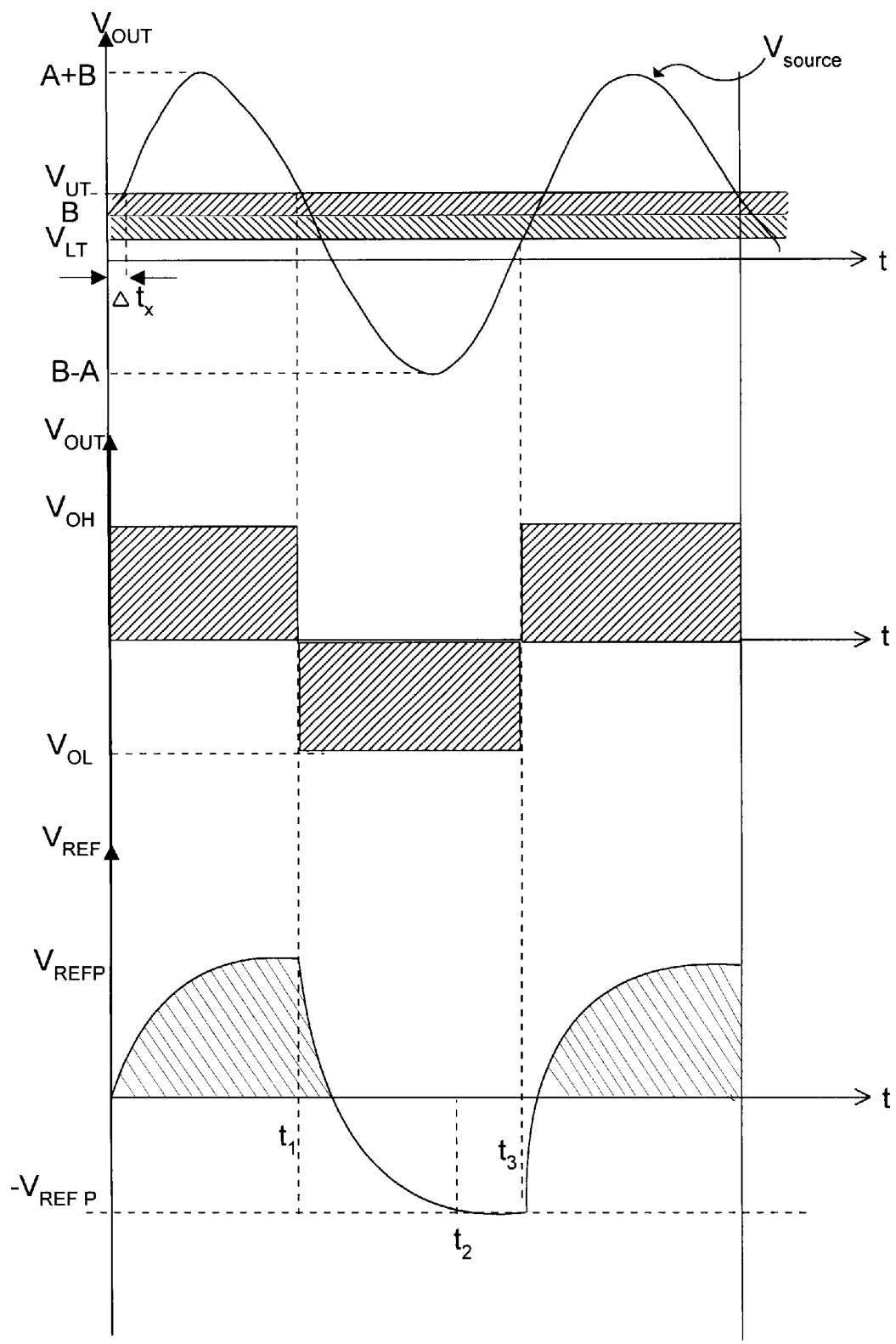
FIG. 10 illustrates exemplary waveforms centered about a non-zero voltage value for an anticipatory Schmitt trigger circuit, in accordance with the present invention.

FIG. 10 shows exemplary wave forms centered about a non-zero voltage (e.g., B at FIG. 10). FIG. 10 shows time varying voltages similar to those shown in FIG. 2, but the voltages of FIG. 10 are centered about a non-zero DC offset voltage (e.g., B) rather than zero volts as in FIG. 2. With a DC offset, the equations for $V_{UT}$ and $V_{LT}$ disclosed herein may still be used. But tau ($\tau$) is determined by the following equation:

$$\tau > \frac{2 \cdot \Delta t_x}{5}$$

and $\Delta t_x$ is determined by the following equation:

$$\Delta t_x = \frac{1}{\omega} \sin^{-1}\left(\frac{V_{UT} - B}{A}\right)$$

where $\omega$ is twice the product of $\pi$ (pi) and f; f is the frequency in Hertz of the source voltage (e.g., $V_s$ 105 at FIG. 1); A is the magnitude of the source voltage; B is the offset value (e.g., the predetermined voltage value); and $V_{UT}$ is the upper threshold voltage.

The foregoing description of a preferred embodiments of the invention has been presented for purposes of illustration and description. It is not intended to be exhaustive or to limit the invention to the precise form disclosed, and modifications and variations are possible in light of the above teachings or may be acquired from practice of the invention. For example, the present invention is not limited to the system disclosed, but is capable of being embodied in a variety of ways and services. Moreover, the present invention may be incorporated into a heating, ventilation, and air conditioning system to provide, for example, signal conditioning and/or threshold detection for switching purposes.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A trigger circuit comprising:
   a comparator;
   a feedback resistor connected to the comparator;
   an input resistor connected to the comparator, to the feedback resistor, and to a voltage source;
   a pull-up resistor directly connected to the feedback resistor and to the output of the comparator;
   a plurality of voltage divider resistors, wherein at least one of the plurality of voltage divider resistors is directly connected to the output of the comparator and to an input of the comparator; and
   a capacitor connected in parallel to at least one of the plurality of voltage divider resistors.

2. The trigger circuit of claim 1, wherein the at least one of the inputs to the comparator connects to an input voltage through an input resistor, and wherein the at least one of the inputs to the comparator connects to the output of the comparator through the feedback resistor.

3. The trigger circuit of claim 1, wherein the at least one of the plurality of voltage divider resistors connects to the output of the comparator and to an input of the comparator, connects to a second of the at least one of the plurality of voltage divider resistors, and connects to the capacitor.

4. A trigger circuit comprising:
   a comparator with a plurality of inputs and an output;
   an input resistor connecting one of the inputs of the comparator with an input voltage;
   a feedback resistor directly connecting one of the inputs of the comparator to a pull-up resistor and connecting one of the inputs of the comparator to the output of the comparator; and
   a first voltage divider resistor connected to a capacitor, to one of the inputs of the comparator, and to a second voltage divider resistor, wherein the second voltage divider resistor further directly connects to the output of the comparator, wherein the product of the resistance values for the first voltage divider resistor and the feedback resistor exceeds the product of the resistance values for the input resistor and the second voltage divider resistor when the trigger circuit is of the non-inverting type.

5. The trigger circuit of claim 4, wherein the product of the resistance values for the first voltage divider resistor and the feedback resistor is less than the product of the resistance values for the input resistor and the second voltage divider resistor when the trigger circuit is of the inverting type.

6. The trigger circuit of claim 5, wherein said trigger circuit switches from a output low voltage to a output high voltage when said input voltage to the trigger circuit crosses a lower threshold voltage.

7. The trigger circuit of claim 6, wherein the lower threshold voltage, $V_{LT}$, is determined by the following:

$$V_{LT} = V_{OL}\left(\frac{R2 \cdot R3 - R1 \cdot R4}{R2(R3 + R4)}\right)$$

wherein $V_{OL}$ is the output low voltage, R1 is the input resistor, R2 is the feedback resistor, R3 is the first voltage divider resistor, and R4 is the second voltage divider resistor.

8. The trigger circuit of claim 5, wherein the input resistor comprises a plurality of input resistors.

9. The trigger circuit of claim 5, wherein the feedback resistor comprises a plurality of feedback resistors.

10. The trigger circuit of claim 5, wherein the first voltage divider resistor comprises a plurality of voltage divider resistors.

11. The trigger circuit of claim 5, wherein the second voltage divider resistor comprises a plurality of voltage divider resistors.

12. The trigger circuit of claim 5, wherein the pull-up resistor comprises a plurality of pull-up resistors.

13. The trigger circuit of claim 5, wherein at least one of the inputs of the comparator is positive and is connected to the input resistor and to the feedback resistor.

14. The trigger circuit of claim 5, wherein at least one of the inputs of the comparator is negative and is connected to the first voltage divider resistor, to the second voltage divider resistor, and to the capacitor.

15. The trigger circuit of claim 5, wherein at least one of the inputs of the comparator is negative and is connected to the input resistor and to the feedback resistor.

16. The trigger circuit of claim 5, wherein at least one of the inputs of the comparator is positive and is connected to the first voltage divider resistor, to the second voltage divider resistor, and to the capacitor.

17. The trigger circuit of claim 4, wherein the trigger circuit switches from a output high voltage to a output low voltage when the input voltage to the trigger circuit crosses an upper threshold voltage.

18. The trigger circuit of claim 17, wherein the upper threshold voltage, $V_{UT}$, is determined by the following:

$$V_{UT} = V_{OH}\left(\frac{R2 \cdot R3 - R1 \cdot R4}{R2(R3 + R4)}\right)$$

wherein $V_{OH}$ is the output high voltage, R1 is the input resistor, R2 is the feedback resistor, R3 is the first voltage divider resistor, and R4 is the second voltage divider resistor.

19. A method of triggering a circuit, comprising switching the output voltage from a first output value to a second output value, when an input to the trigger circuit decreases from a first value and when the input voltage crosses an upper threshold voltage, wherein said switching occurs in anticipation of crossing a predetermined voltage value; and changing the output voltage from the second output value to the first output value, when the input to the trigger circuit increases from a second value and when the input voltage crosses a lower threshold voltage, wherein said changing occurs in anticipation of crossing the predetermined voltage value.

20. The method of claim 19, wherein the first output value is a high value and the second output value is a low value.

21. The method of claim 20, further comprising maintaining the output voltage of the triggering circuit at the low value until the step of changing changes the output voltage from the low value to the high value.

22. The method of claim 21, further comprising continuing the output voltage of the triggering circuit at the high value until the step of switching transitions the output voltage from the high value to the low value.

23. The method of claim 21, wherein the low threshold, voltage $V_{LT}$, is defined by the following:

$$V_{LT} = V_{OL}\left(\frac{R2 \cdot R3 - R1 \cdot R4}{R2(R3 + R4)}\right)$$

wherein $V_{OL}$ is an output low voltage, R1 is an input resistor, R2 is a feedback resistor, R3 is a first voltage divider resistor, and R4 is a second voltage divider resistor.

24. The method of claim 21, wherein the upper threshold voltage, $V_{UT}$, is defined by the following:

$$V_{UT} = V_{OH}\left(\frac{R2 \cdot R3 - R1 \cdot R4}{R2(R3 + R4)}\right)$$

wherein $V_{OH}$ is a voltage output high, R1 is an input resistor, R2 is a feedback resistor, R3 is a first voltage divider resistor, and R4 is a second voltage divider resistor.

* * * * *